(12) United States Patent
Adams et al.

(10) Patent No.: US 6,239,473 B1
(45) Date of Patent: May 29, 2001

(54) TRENCH ISOLATION FOR MICROMECHANICAL DEVICES

(75) Inventors: Scott G. Adams; Kevin A. Shaw; Russell Y. Webb; Bryan W. Reed; Noel C. MacDonald, all of Ithaca; Timothy J. Davis, Trumansburg, all of NY (US)

(73) Assignees: Kionix, Inc.; Cornell Research Foundation Inc., both of Ithaca, NY (US)

( * ) Notice: Subject to any disclaimer, the term of this patent is extended or adjusted under 35 U.S.C. 154(b) by 0 days.

(21) Appl. No.: 09/231,082

(22) Filed: Jan. 14, 1999

Related U.S. Application Data
(60) Provisional application No. 60/071,390, filed on Jan. 15, 1998.

(51) Int. Cl.[7] ................................................. H01L 29/84
(52) U.S. Cl. ........................... 257/419; 257/417; 257/254
(58) Field of Search .................................... 257/254, 417, 257/419

(56) References Cited

U.S. PATENT DOCUMENTS

| | | |
|---|---|---|
| 5,235,187 | 8/1993 | Arney et al. . |
| 5,287,082 | 2/1994 | Arney et al. . |
| 5,397,904 | 3/1995 | Arney et al. . |
| 5,426,070 | 6/1995 | Shaw et al. . |
| 5,427,975 | 6/1995 | Sparks et al. .......................... 437/79 |
| 5,449,903 | 9/1995 | Arney et al. . |
| 5,536,988 | 7/1996 | Zhang et al. . |
| 5,628,917 | 5/1997 | MacDonald et al. .................... 216/2 |
| 5,726,073 | 3/1998 | Zhang et al. . |
| 5,759,913 | 6/1998 | Fulford, Jr. et al. .................. 438/624 |
| 5,770,645 | 6/1998 | MacDonald et al. ................... 437/67 |
| 5,804,084 | 9/1998 | Nasby et al. ............................... 216/2 |
| 5,847,454 | 12/1998 | Shaw et al. . |
| 5,998,816 | * 12/1999 | Nakaki ................................. 257/254 |

OTHER PUBLICATIONS

"Embedded Interconnect & Electrical Isolation for High–Aspect–Ratio, SOI Inertial Instruments", Timothy J. Brosnihan, James M. Bustillo, Albert P. Pisano & Roger T. Howe, Berkeley Sensor & Actuator Sensor, 1997; pp. 637–640.

"Micromachines on the march", Janusz Bryzek, Kurt Petersen & Wendell McCulley, IEEE Spectrum, May 1994; pp. 20–31.

* cited by examiner

Primary Examiner—Jerome Jackson, Jr.
(74) Attorney, Agent, or Firm—Jones, Tullar & Cooper, P.C.

(57) ABSTRACT

An isolation process which enhances the performance of silicon micromechanical devices incorporates dielectric isolation segments within the silicon microstructure, which is otherwise composed of an interconnected grid of cantilevered beams. A metal layer on top of the beams provides interconnects and also allows contact to the silicon beams, electrically activating the device for motion or transduction. Multiple conduction paths are incorporated through a metal patterning step prior to structure definition. The invention improves manufacturability of previous processes by performing all lithographic patterning steps on flat topographies, and removing complicated metal sputtering steps required of most high aspect ratio processes. With little modification, the invention can be implemented with integrated circuit fabrication sequences for fully integrated devices.

14 Claims, 8 Drawing Sheets

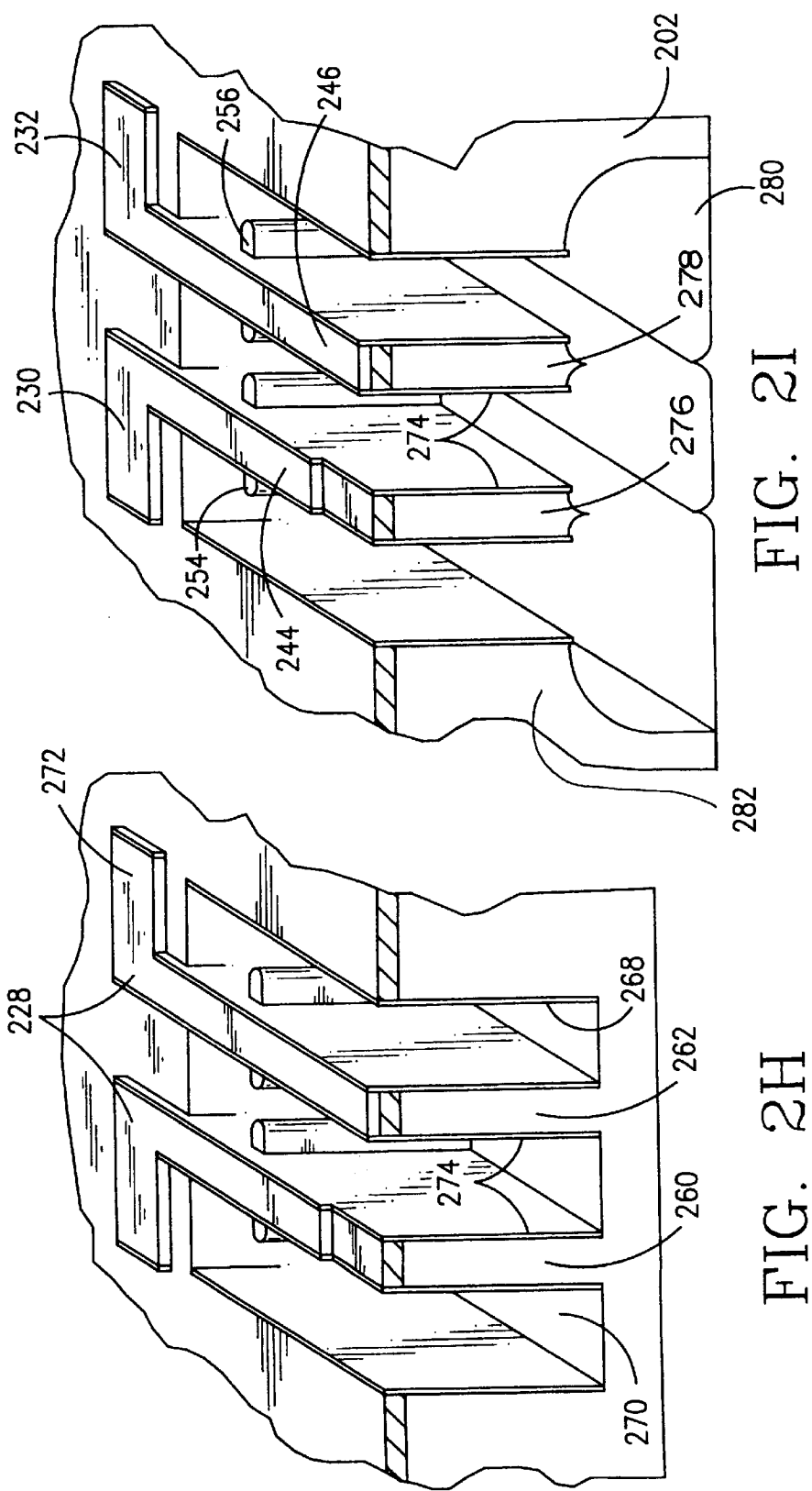

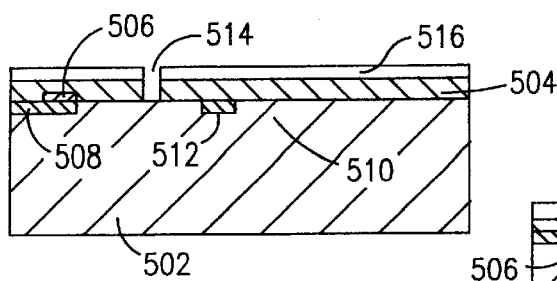
FIG. 5A
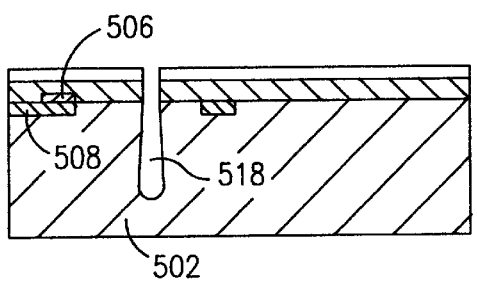
FIG. 5B
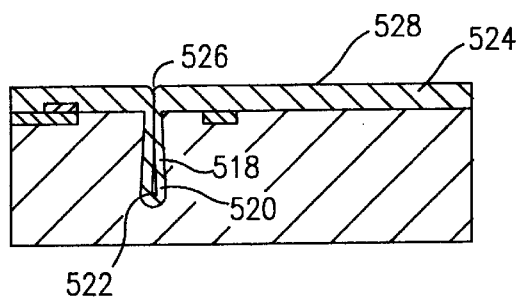
FIG. 5C
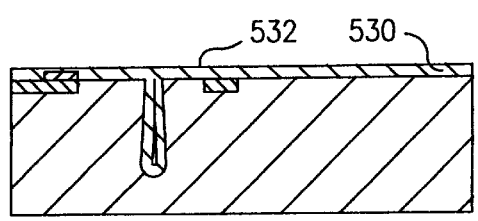
FIG. 5D
FIG. 5E
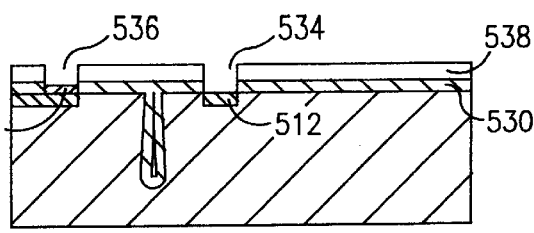
FIG. 5F
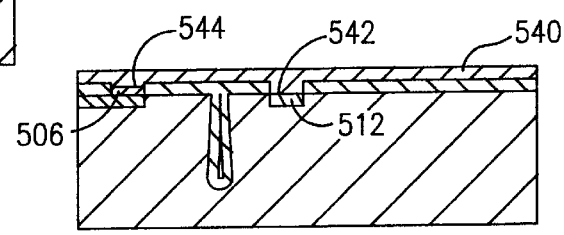
FIG. 5G
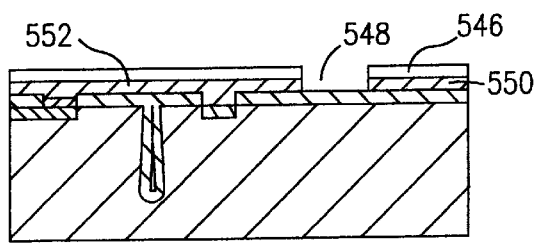
FIG. 5H
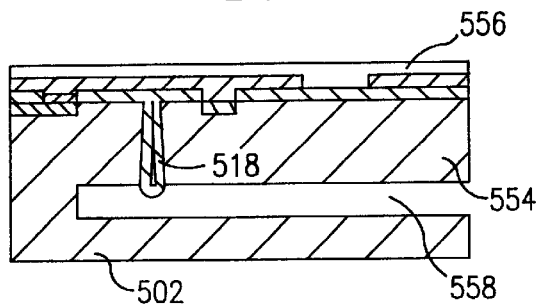

TRENCH ISOLATION FOR MICROMECHANICAL DEVICES

This application claims the benefit of U.S. Provisional application No. 60/071,390 filed Jan. 15, 1998, the disclosure of which is incorporated herein by reference.

This invention was made with government support under contract number F30602-97-2-0104 awarded by DARPA. The government holds certain rights in the invention.

BACKGROUND OF THE INVENTION

The field of the present invention relates generally to microdevices and microstructures, and more particularly to microfabrication processes to create micromechanical or microelectromechanical devices with integral electrical isolation structures within the devices.

Microelectromechanical systems (MEMS) refers to a technology in which electrical and mechanical devices are fabricated at substantially microscopic dimensions utilizing techniques well known in the manufacture of integrated circuits. Present commercial applications of MEMS technology are predominantly in pressure and inertial sensing, with an emphasis on automotive applications thereof. For an introduction to the use of MEMS technology for sensors and actuators, see for example the article by Bryzek et al. in *IEEE Spectrum*, May 1994, pp. 20–31.

The fabrication processes for MEMS, called micromachining, are borrowed from the integrated circuit industry, where semiconductor devices are fabricated using a sequence of patterning, deposition, and etch steps. Surface micromachining has typically used a deposited layer of polysilicon as the structural micromechanical material. The polysilicon is deposited over a sacrificial layer onto a substrate, typically silicon, and when the sacrificial layer is removed the polysilicon remains free standing. Bulk micromachining techniques, rather than using deposited layers on a silicon substrate, etch directly into the silicon wafer to make mechanical structures of the single crystal silicon itself. Bulk micromachining was first practiced using anisotropic wet chemical etchants such as potassium hydroxide, which etch faster in certain crystallographic planes of silicon. However, advancements in reactive ion etching (RIE) technology have made practical, and in many ways preferential, the use of dry plasma etching to define micromechanical structures. Reactive ion etching techniques are independent of crystal orientation, and can create devices exceeding the functionality of surface micromachined devices. The use of single-crystal materials, particularly silicon, can be beneficial for mechanical applications because of the lack of defects and grain boundaries, maintaining excellent structural properties even as the size of the device shrinks.

Deep reactive ion etching techniques developed specifically for the MEMS industry have enabled a greater range of functionality for bulk micromachining. Processes such as those described in U.S. Pat. No. 5,501,893 are now supplied by commercial etch vendors specifically for bulk micromachining. These processes provide silicon etch rates in excess of 2 um/min with vertical profiles and selectivity to photoresist greater than 50:1 or selectivity to silicon oxide greater than 100:1. This enables bulk micromachined structures to span the range from several microns deep to essentially the thickness of an entire wafer (>300 um).

The predominant difficulty in bulk micromachining is the requirement for most devices that the silicon of the microstructure be mechanically connected to but electrically isolated from the substrate silicon. In particular, if the device is electrically activated or transduced, the current path from the structure to the substrate must be reduced or effectively eliminated in order that the device function appropriately. This requirement has proven to be the most difficult to achieve in fabrication.

An example of a process for bulk micromachined structures is described in U.S. Pat. No. 5,719,073 which is assigned to the assignee of the present application, the disclosure of which is hereby incorporated herein by reference. This process uses a single mask layer and appropriate etch and deposition steps to create a fully self-aligned, metalized bulk micromachined structure. Reactive ion etching is used to define and undercut an array of cantilever beams, which are connected together in order to form a more complete functional microstructure. All structure elements and interconnects are formed with the same masking layer, and isotropic dry etch techniques are used to release the structural layer. The advantages of the process are the simplicity of the single masking layer, the reactive ion etch release process, the self-aligned metalization, and high manufacturing yield.

The process flow for the '073 patent defines a pattern in a dielectric mask which is transferred to the single crystal material substrate by a 10–20 um trench etch. After the sidewalls of the trench are protected using a second dielectric layer, such as silicon dioxide, the silicon islands or mesas are undercut and released using an isotropic reactive ion etch. The released silicon mesas essentially become the cantilever beams. A final self-aligned metal layer is deposited onto the oxide layer on the beams, allowing electrical connection to the structure. The process of the '073 patent can be carried out on a wafer having existing integrated circuitry, in which case the individual process steps are all performed at a temperature of less than 300° C.

With the self-aligned metal layer of the '073 patent, only one electrical connection is made to the microstructure. In situations where several connections are necessary, additional photolithography or masking steps must be performed on the released structure. These additional steps limit device yield, since photoresist application on and removal from a released microstructure often results in device failure. Although the metal layer of the '073 patent is self-aligned, it has been found that evaporation or sputtering of metal on the sidewalls of 10–20 um deep beams is a difficult, nonstandard process step, and the resulting metal layer is often highly nonuniform in thickness and will coat only a portion of the total beam depth. Further, a metal-oxide-silicon interface is a source of parasitic capacitance for those devices which rely on opposing metal layers for capacitive actuation and transduction and the large area provided by the beam sidewalls in the '073 patent and the metal-oxide-silicon beam structure directly results in a large parasitic capacitance. For many inertial sensing devices, the variable capacitance provided by opposing beam sidewalls is actually exceeded by the parasitic capacitance to the substrate silicon.

An attempt to modify the process of the '073 patent to reduce the level of parasitic capacitance, and thus improve the device performance, resulted in the invention described in U.S. Pat. No. 5,426,070, also assigned to the assignee of the present invention. Here, an oxidation step is carried out to consume sections of the silicon beams, converting these sections completely to oxidized segments. As a result, the remaining silicon of the microstructure is electrically isolated from the substrate silicon by an oxide beam segment. However, the thick oxide layer required for the insulating segment is also grown on sidewall surfaces of the surviving silicon beams, drastically modifying the mechanical performance of the composite beams. In addition, the self-aligned metalization creates only one contact to the microstructure and since the metal is required to coat the sidewalls of the beams, the result is the non-uniform and unreliable metal coverage described above.

Other techniques for providing isolation and parasitic capacitance reduction for bulk micromachined devices have been attempted. Many have relied on the use of specially prepared substrates such as silicon-on-insulator, where the wafer has a built-in buried oxide layer. The microstructure is formed from the silicon layer existing on the top of the buried layer, and released using chemical etching of the buried layer. However, the chemical etch to release the silicon microstructure has relatively low yield, and the substrate itself is specialized and expensive. In Brosnihan, et al., "Embedded interconnect and electrical isolation for high-aspect-ratio, SOI inertial instruments," Transducers 97, pp. 637–640, the authors combine the SOI substrate with nitride and polysilicon isolation blocks. However, the structure definition and release still depend on the buried SOI layer and the resulting expensive substrate preparation.

As bulk micromachined devices increase in complexity it becomes increasingly important to improve their electrical performance. Multiple electrical connections are required for more complex MEMS devices. Electrical isolation between the various connections, and between the structure and the substrate, are also required. Typically such isolation is accomplished in the prior art by separating conducting metal layers by insulating dielectric layers. See for example U.S. Pat. No. 5,611,940. It is also well known in the prior art to provide dielectric isolation regions between microelectronic devices or conductors in integrated circuits, as in U.S. Pat. Nos. 4,688,069 and 4,876,217. A particularly beneficial approach to electrical isolation has been the use of trenches filled with insulating material, described in U.S. Pat. Nos. 4,104,086, 4,509,249, 4,571,819, and 4,519,128. Although the electrical isolation schemes in the prior art are very satisfactory for conventional integrated circuit devices, they have serious shortcomings when applied to microelectromechanical devices.

MEMS devices contain moving mechanical microstructures, typically exhibiting substantially three-dimensional geometries. The existence of these structures precludes, or makes very difficult, the application of electrical isolation schemes such as those described in the prior art. Such schemes involve multiple steps of lithography, etching, and deposition. These steps are not feasible on structures exhibiting large topographic variations, nor on microstructures which have been previously released for motion.

What is required for effective electrical isolation in MEMS devices is a new electrical isolation process which must be compatible with the specific requirements and limitations of MEMS devices, most notably the existence of released, movable microstructures.

What is also required of the electrical isolation process is that it provide isolation between adjacent mechanical structures, between different electrical segments, and between the device and the substrate material. In bulk micromachining, this most often means breaking the electrical continuity between the structure silicon and the substrate silicon. It is desired that such an isolation structure should also provide for reduced parasitic capacitance in the device. MEMS sensors typically require the ability the measure very small changes in electrical charge or capacitance, and therefore must minimize the effect of parasitic circuit elements.

Further what is needed is an electrical isolation process which does not have an adverse impact on the manufacturing yield of MEMS devices. The commercial viability of MEMS technology depends on cost effective manufacturing of products. Prior art electrical isolation schemes may result in very low manufacturing yields and hence unacceptably high costs for most MEMS product applications.

SUMMARY OF THE INVENTION

In order to achieve the foregoing and to overcome the problems inherent in prior electrical isolation schemes, the present invention is directed to a beam-level isolation technique in which insulating segments are incorporated within silicon beam microstructures to provide electrical isolation.

It is therefore an object of the present invention to provide suitably modified trench isolation techniques, utilizing dielectric materials, in conjunction with micromechanical device fabrication processes to achieve electrical isolation within the microstructure.

It is a further object of the invention to eliminate the use of unsuitable and unreliable sidewall metal layers for electrical activation of a MEMS device, and instead to use the silicon cores of microstructure beams for conduction and as capacitor plates. This is achieved by creating contacts from a metal layer through a dielectric layer to the silicon beams using techniques which are common in the art.

It is a further object of the invention to provide multiple metal interconnections within a MEMS device. This is achieved by placing metal conductor lines over isolation segments and on top of cantilever beams to provide multiple metal paths. The conductor lines are separated from the core silicon by an insulating layer which is also present on top of the beams, thus achieving isolation between the metal and the silicon.

It is a further object of the invention to alleviate dielectric-induced stress on silicon beam microstructures by minimizing the amount of sidewall film present on the silicon. Thermal oxidation of existing beam structures creates a thick sidewall oxide film which dominates device characteristics. By performing isolation processes before structure formation, sidewall films can be reduced or even eliminated, and hence passivation films can be rendered unimportant to device performance.

It is a further object of the invention to provide a trench isolation process for fabricating microstructures which is scalable to different structure etch depths, while maintaining high manufacturing yield. The trench isolation process may be scaled to etch depths greater than 50 um using deep reactive ion etching techniques, and can be adjusted to a particular microstructure depth. Planar lithography for the isolation segments, metal deposition, and structure definition maintains high manufacturing yield and does not deviate from techniques common to the semiconductor processing industry.

Although the preferred embodiment of the invention is to use thermal oxidation to form the isolation segments, other lower temperature chemical vapor deposition techniques can also be used for trench isolation. Further, even with high temperature oxidation steps, it is possible to integrate the micromechanical isolation process with integrated circuits without significant interleaving of the process steps.

Briefly, the basic process begins by defining an isolation trench pattern for a desired micromechanical structure on an oxide coated silicon wafer. The pattern defines the region, or regions, where dielectric isolation segments will be placed. These dielectric segments serve to separate the silicon of the micromechanical structure from the silicon of the substrate. The pattern for the dielectric segments present in the exposed photoresist is transferred to the oxide underlayer using a reactive ion etch. Then, an isolation trench is defined in the wafer using silicon reactive ion etching, typically 1–1.5 um wide and 10–50 um deep into the substrate silicon. The shape of the trench, or the trench profile, is optimized to improve the isolation properties of the segment in conjunction with the remainder of the microstructure processing steps. In the preferred embodiment, the trench profile is reentrant, with a wider width at the bottom of the trench than at the top of the trench. The purpose of shaping the trench is to reduce the possibility of silicon filaments forming during the remainder of the processing. Such filaments may surround the isolation segment and provide a leakage path which reduces the efficacy of the isolation.

After the isolation trench is defined, the trench is filled with a dielectric, preferably with a thermal oxidation step. Alternatively, the trench may be filled using chemical vapor deposition techniques with silicon dioxide or silicon nitride. During thermal oxidation, the silicon sidewalls of the trench are consumed to form silicon dioxide, and the resulting volumetric expansion narrows the trench opening to effectively fill the trench. Because of the high aspect ratio of the trench, a void is often formed within the dielectric. Unlike most electrical isolation schemes, however, the void is unimportant to device operation.

After the trench is filled, the wafer surface has small topography variations around the locations of the isolation segments. Therefore, a planarization step is performed, normally with photoresist, to smooth the surface of the wafer and prepare it for the patterning and deposition steps to follow. An application of resist or other viscous material, and subsequent etchback, is used to planarize the small nonuniformities in the surface and reduce the thickness of the dielectric on the surface of the wafer.

Next, a second masking layer defines vias in locations where connection is to be made from a subsequent metal layer to the silicon beam structures or the silicon substrate. Eventually, metal to silicon contacts are made through the vias as is typical of integrated circuit processing. The via pattern in the photoresist is transferred to the silicon oxide using RIE processes, and the silicon surface is exposed for contact processing. After implantation and annealing of dopants, the metal layer is sputter deposited. The metal layer forms the contacts to the underlying silicon and is also used, in conjunction with further processing, to create multiple interconnections to the micromechanical device.

A third photolithography step coarsely patterns the metal in preparation for the final structure etches. The coarse metal pattern is transferred to the metal layer using a wet chemical etch step or a dry reactive ion etch. The coarse metal patterning step removes metal from the regions where the interconnections are to be broken. A final lithographic patterning step defines the micromechanical structure in the form of an interconnected grid of silicon beams. The beams are created by transferring the photoresist pattern through the metal and dielectric masking layers. Silicon islands or mesas are defined using a silicon trench etch which surrounds the mesa features. After the sidewalls of the beams are passivated using a dielectric layer, the beam features are released using an isotropic reactive ion etch. The sidewall passivation layers can be removed, if desired, by another isotropic reactive ion etch, etching dielectric preferentially to silicon.

In summary, the process of this invention creates a silicon structure similar to those developed in the '703 patent, but offering several substantial advantages. A metal conductive layer is present on the top of the beam structures only. Isolation segments are incorporated into the silicon beams, reducing parasitic capacitance and providing multiple structure connections. In regions where capacitive actuation or sensing is required, the metal layer contacts the beam silicon cores, which serve as the capacitor plates. This is allowed because the isolation segments interrupt the conduction path from the silicon beams to the substrate silicon. Multiple conduction paths are possible using the top conductive metal layers and the contacts to the underlying silicon. The process is greatly improved from the prior art because a sidewall metal layer is not required, and multiple connections to the released microstructure are possible. The process is inherently manufacturable because all photolithography steps are performed on a flat surface, and none are performed on a released structure. The process can be merged with integrated circuits to create fully integrated systems on a chip.

BRIEF DESCRIPTION OF THE DRAWINGS

The foregoing and additional objects, features, and advantages of the present invention will become apparent to those of skill in the art from the following detailed description of a preferred embodiment thereof, taken with the following drawings, in which:

FIGS. 2a–2i illustrate the basic process in perspective view;

FIGS. 5a–5h illustrate a method to implement the isolated microstructure with an integrated circuit.

DETAILED DESCRIPTION OF THE INVENTION

Although a number of variations of the invention are possible, the basic process is illustrated in FIGS. 1A–1H. which show in cross section the steps for fabricating from a silicon wafer a single released micromechanical beam with a single incorporated isolation segment. It will be understood from the process outlined in subsequent sections, that an entire micromechanical structure may be composed of any number of such beams, connected to each other and/or to the wafer in a manner to provide full device functionality.

Figure 1A:
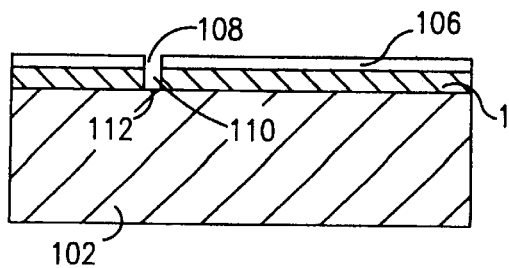
FIGS. 1a–1h diagrammatically illustrate the basic trench isolation process of the invention.

Referring to FIG. 1A, a silicon wafer 102 is provided with a dielectric layer 104, preferably silicon dioxide (oxide). The silicon wafer can be of arbitrary doping, resistivity, and crystal orientation, since the process depends only on reactive ion etching to carve and form the structures. The layer 104 serves the function of protecting the silicon surface of the wafer during an isolation trench etch to follow, and thus represents a masking layer only. This masking layer can be formed from any number of techniques, including thermal oxidation of silicon or chemical vapor deposition (CVD). The typical thickness of the masking layer 104 is 0.5–1.0 um. A photoresist 106 is then spun onto the wafer and exposed and developed using standard photolithography techniques to define the isolation trench pattern 108. Reactive ion etching is used to transfer the photoresist pattern to the mask layer 104, as at 110, exposing the silicon surface 112. Typically, the silicon dioxide mask is etched in a Freon gas mixture, for example $CHF_3$ or $CF_4$. High etch rates for silicon dioxide etching are achieved using a high density plasma reactor, such as an inductively coupled plasma (ICP) chamber. These ICP chambers use a high power rf source to sustain the high density plasma and a lower power rf bias on the wafer to achieve high etch rates at low ion energies. Oxide etch rates of 200 nm/min and selectivities to photoresist greater than 1:1 are common for this hardware configuration.

Figure 1E:
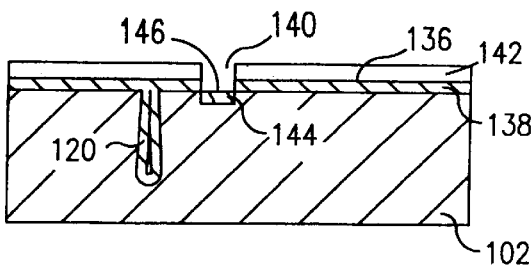
Figure 1B:
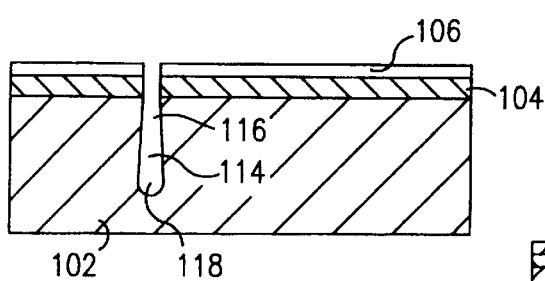

As illustrated in FIG. 1B, an isolation trench 114 is next formed in the wafer 102 by deep reactive ion etching of silicon using high etch rate, high selectivity etching. The trench is commonly etched in a high density plasma using an SF6 gas mixture as described in U.S. Pat. No. 5,501,893. Preferably, the etch is controlled so that the trench profile is reentrant, or tapered, with the top 116 of the trench being narrower than the bottom 118 of the trench. This tapering ensures that good electrical isolation is achieved in subsequent processing. Profile tapering can be achieved in reactive ion etching by tuning the degree of passivation, or by varying the parameters (power, gas flows, pressure) of the discharge during the course of the etch. Since the trench is to be filled with dielectric, the opening at the top 116 of the trench is chosen to be less than 2 um in width. The trench depth is typically in the range 10–50 um. A common procedure for etching the trench is to alternate etch steps ($SF_6$ and argon mixture) with passivation steps (Freon with argon) in an ICP plasma to achieve etch rates in excess of 2 um/min at high selectivity to photoresist (>50:1) and oxide (>100:1). The power and time of the etch cycles are increased as the trench deepens to achieve the tapered profile. Although the trench geometry is preferably reentrant, arbitrary trench profiles can be accommodated with adjustments in microstructure processing. Good isolation results can be achieved with any of a number of known trench etch chemistries. After the silicon trench is etched, the photoresist layer 106 is removed with wet chemistry or dry ashing techniques, and the masking layer 104 is removed with RIE or buffered hydrofluoric acid.

Figure 1F:
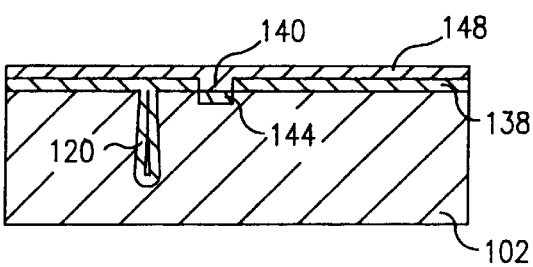
Figure 1C:
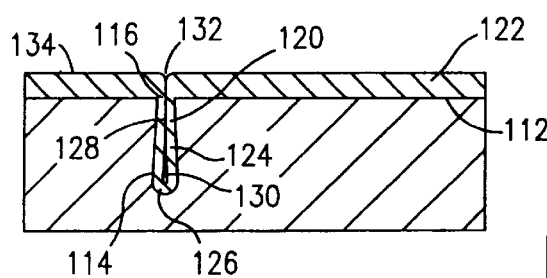

Referring to FIG. 1C, the isolation trench 114 is then filled with an insulating dielectric material, typically silicon dioxide. The filling procedure results in the mostly solid isolation segment 120 in the trench 114, and serves to deposit a layer 122 of dielectric material on the top surface 112 of the silicon wafer and dielectric layers on the sidewall 124 and bottom 126 of the trench. The thickness of the deposited layer is usually in excess of 1 um. This fill can be accomplished with chemical vapor deposition (CVD) techniques or preferably with oxidation of silicon at high temperatures. In thermal oxidation, the wafer is exposed to an oxygen rich environment at temperatures from 900–1150° C. This oxidation process consumes silicon surfaces to form silicon dioxide. The resulting volumetric expansion from this process causes the sidewalls of the trenches to encroach upon each other, eventually closing the trench opening. In a CVD fill, some dielectric is deposited on the walls but filling also occurs from deposition on the bottom of the trench. CVD dielectric fill of trenches has been demonstrated with TEOS or silane mixtures in plasma enhanced CVD chambers and low pressure CVD furnace tubes.

During a trench fill, it is common for most trench profiles to be incompletely filled, causing an interface 128 and a void 130 to be formed in the trench. A local concentration of stress in the void can cause electrical and mechanical malfunction for some devices, but is generally unimportant for micromechanical devices due to the enclosed geometry of the isolation segment 120. The interface 128 and void 130 can be eliminated by shaping the trench to be wider at the trench opening 116 than the trench bottom. However, good electrical isolation would then require additional tapering of the microstructure trench etch in later steps. Another artifact of the trench filling is an indentation 132 that is created in the surface of the dielectric 134, centered over the isolation segment 120. This indentation is unavoidable in most trench filling processes, and can be as deep as 0.5 um, depending on the thickness of the deposition.

Figure 1G:
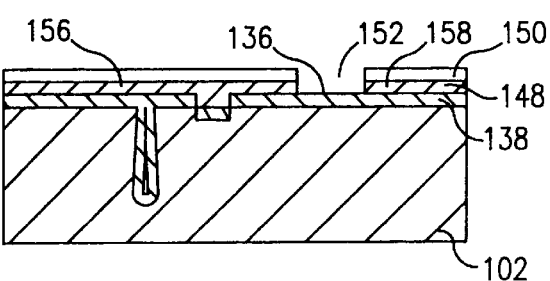
Figure 1D:
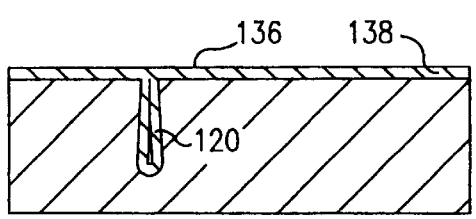

To remove the indentation 132, the surface is planarized to form a flat surface 136, as illustrated in FIG. 1D, for subsequent lithographic and deposition steps. Planarization is performed by depositing a viscous material, which can be photoresist, spin-on glass, or polyimide, and flowing the material to fill the indentation 132 to a smooth finish. During etchback, which is the second step of planarization, the surface 136 is etched uniformly, including the filled indentation. Therefore, by removing part of the surface oxide 122, the indentation 132 is removed to create a uniform thickness layer 138. For example, if the original dielectric layer 122 is 2 um, then planarization to remove the indentation 132 leaves a dielectric layer 138 having a final thickness of less than 1 um. The surface 136 of the wafer is free from imperfection and is ready for further lithography and deposition.

In FIG. 1E, a second photolithography step opens vias to prepare contacts to the underlying silicon 102. This second lithographic step is performed by exposing and developing a pattern of via openings 140 in a layer of resist 142 on surface 136 and transferring the pattern into the underlying dielectric layer 138. After lithography, the silicon is implanted in the region 144 using dopants matched to the substrate silicon 102. A high concentration of dopants, either p or n type, in the region 144 will serve to create an ohmic contact between the silicon and a metal layer on the surface of dielectric layer 138. The silicon region 144 may be protected from implant damage by leaving a thin layer of dielectric at the surface 146 of the silicon. After the silicon is implanted, the resist 142 is removed with wet chemicals or ashing and the wafer is annealed to activate the implanted ions.

A sputtered metal layer 148, preferably aluminum, is deposited in FIG. 1F. The metal covers the surface 136 of the dielectric 138, and uniformly coats over the isolation segment 120 as a result of the planarizing step. The metal layer fills the via 140 and contacts the implanted region of silicon at 144, electrically connecting the metal to the silicon to form an ohmic contact. Otherwise the metal layer is insulated from the substrate silicon 102 by means of the dielectric layer 138. The thickness of the metal layer is nominally 0.5 um, although arbitrary thickness is acceptable. Sputtering is preferably used instead of evaporation because of the ease of volume production. As known in the prior art, some silicon or copper content in an aluminum layer, or target, will improve resistance to electromigration-induced failure.

A third photolithography step is shown in FIG. 1G. Lithography is performed with a spun on resist layer 150 on the top surface of the metal layer 148. The resist is patterned to provide open areas 152 where metal is not desired; this step is referred to as coarse metal patterning. The opening 152 in the resist is transferred to the metal layer 148 by wet chemical etching or reactive ion etching. For aluminum RIE, a combination of $BCL_3$ and $CL_2$ in a parallel plate etcher is known in the art. The etch is stopped at the surface 136 of the oxide layer 138. The removal of metal at the opening 152 separates the region of metal 156 from the region of metal 158 on the top of an individual beam element. This is important in situations where multiple interconnection paths are required to and on the micromechanical structure.

Figure 1H:
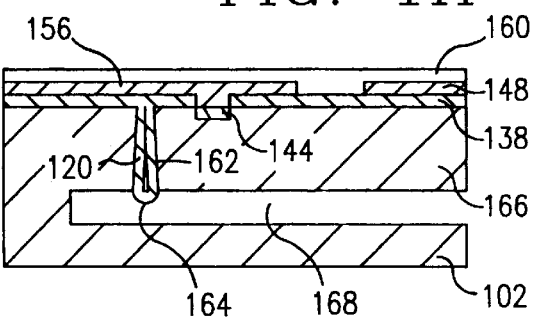

The micromechanical beams are created, as illustrated in FIG. 1H, by applying the techniques of the '703 patent. Thus a final, fourth lithographic step is applied using photoresist layer 160, which is patterned to define an array of beam structures of width 1–3 um connected to create the entire micromechanical structure. The photoresist pattern is transferred through the metal layer 148 using reactive ion etching, and then through the dielectric layer 138 using RIE techniques. The layers of photoresist, metal, and dielectric then serve as an etch mask for another deep silicon trench etch, which surrounds a beam structure to be formed. The beam structure includes the isolation segment 120, with the tapered structure of the isolation trench 120 ensuring that as the deep structure trench etch proceeds, no silicon filaments will remain surrounding the surface 162 of the isolation segment 120. The deep structure trench etch depth is chosen to be less than the depth of the isolation segment 120 to ensure that no silicon underbridge will form on the bottom 164 of the dielectric in the isolation trench 114. The presence of silicon filaments on the surfaces 162 or 164 will destroy the isolation properties of the segment 120 by allowing a conduction path to the substrate 102.

To undercut or release a silicon beam 166, a passivation dielectric layer is deposited on the wafer and in the deep structure trenches in the manner of the '703 patent. After the dielectric is cleared from the trench floor, an isotropic silicon etch is performed to undercut the beam structure and leave a cavity 168 extending under the silicon beam 166, between the beam and the substrate 102. The beam sidewall passivation dielectric may be removed in order to leave only the silicon and the top thin films as the composite mechanical beam structure.

Due to the foregoing isolation process, electrical connection is broken between the silicon beam 166 and the substrate 102 by the isolation segment 120. The silicon beam 166 is cantilevered over the substrate 102 within the cavity 168, freeing it to move laterally in the plane of the wafer. The isolation segment 120 is an integral part of the beam, also released in the cavity 168 from the substrate 102. Electrical connection is made from the metal region, or interconnect 156 to the silicon beam 166 by means of the contact region 144, allowing the silicon beam to be connected to suitable electrical circuitry for use as a capacitor in actuating and sensing applications.

Figure 2A:
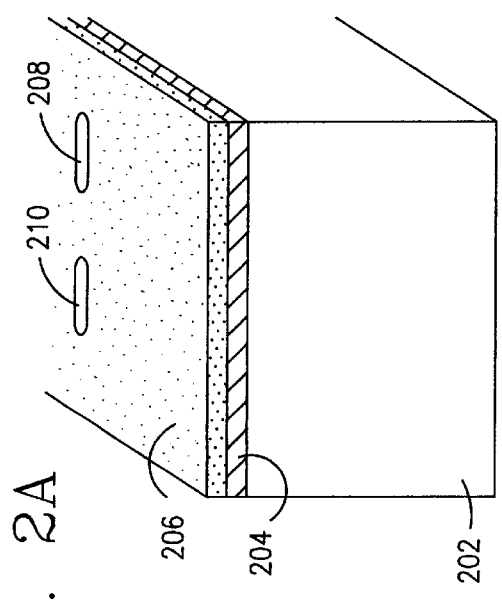

FIGS. 2A–2I illustrate the process of the basic invention, in perspective view, in the formation of two parallel cantilevered beams, each including an isolation segment. Referring to FIG. 2A, the process begins with a silicon wafer 202 which has a dielectric masking layer 204, preferably silicon dioxide, and photoresist layer 206. It is possible to begin the process without the dielectric layer and rely only on photoresist to mask the isolation trench etch. The photoresist is exposed and developed to create two isolation trench openings 208 and 210. This pattern is transferred to the dielectric using RIE, exposing the surface of the silicon substrate 202. Isolation trenches are then etched into the substrate silicon using silicon RIE, with the depths and profiles described in detail in the description of FIG. 1. The resist layer 206 and the dielectric layer 204 are stripped in preparation for trench filling.

Figure 2B:
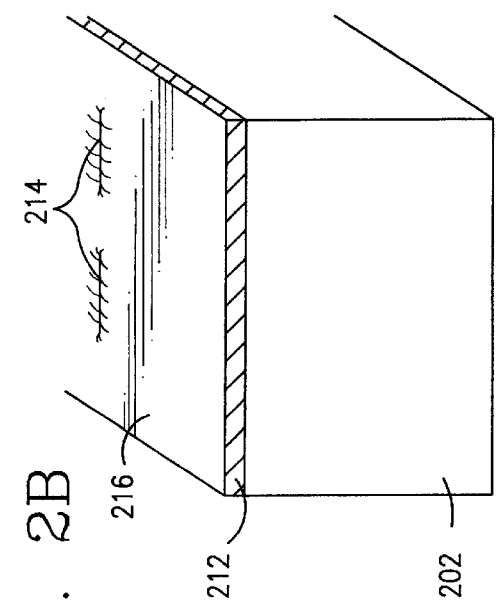
Figure 2C:
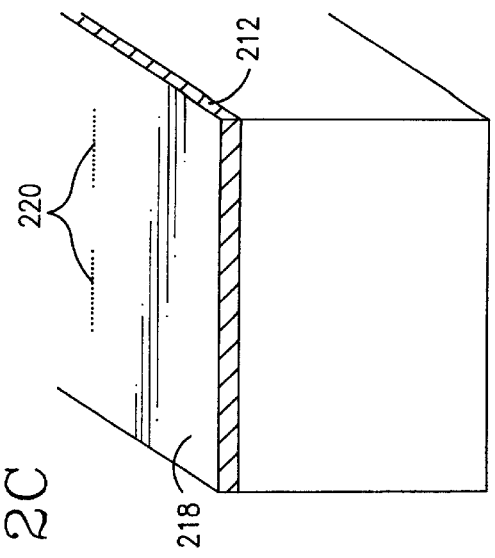

In FIG. 2B, the isolation trenches are filled using thermal oxidation or CVD techniques to create two isolation segments. The filling process results in a thick dielectric layer 212 and indentations 214 in the surface of the dielectric 216, producing two solid isolation segments that are to be incorporated within the micromechanical structure. To remove the indentations, the surface is planarized using a deposition and etchback process. FIG. 2C shows the results of the planarization, which has removed most or all of the surface indentations 214, leaving minimal features 220 in the areas where the isolation trenches exist. The dielectric 218 thickness will remain as a masking material and an insulating material for the final microstructure, and must therefore retain good electrical and mechanical qualities. The thickness of dielectric layer 218 is preferably 0.5–10 um.

Figure 2D:
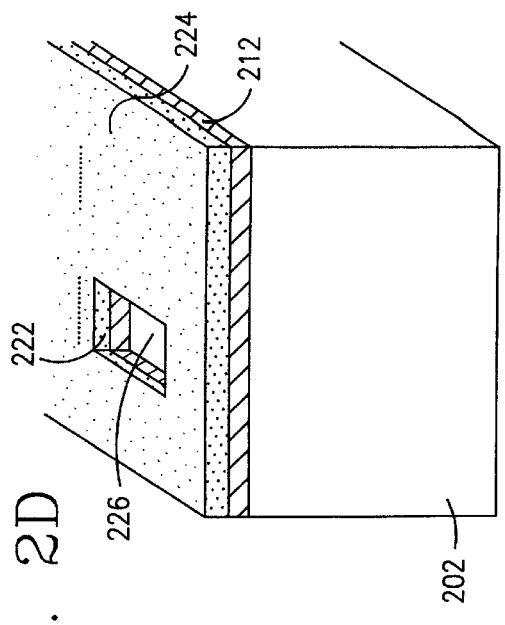
Figure 2G:
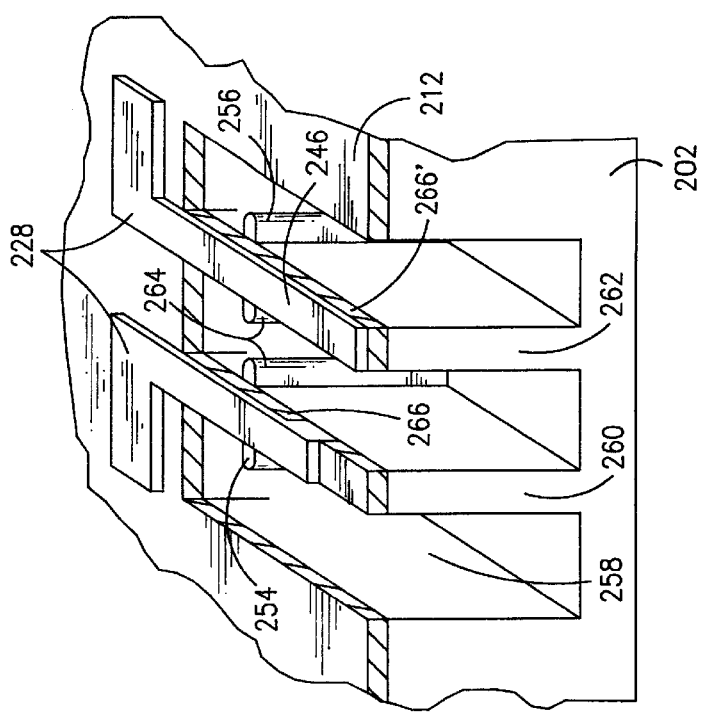

The next photolithographic step is illustrated in FIG. 2D, where a via pattern 222 is exposed and developed in the photoresist layer 224 by a normal lithography process. The resist pattern is transferred through the dielectric layer 212 by reactive ion etching to reveal the silicon surface 226 in the region of the via. Alternatively, the revealed silicon surface 226 may remain protected by a thin sacrificial layer of dielectric 212 in order to minimize surface damage during implantation. The wafer 202 is implanted with dopants in the region of the via 222, so as to provide a high conductivity region in the substrate 202. A high temperature anneal activates the implant and prepares the wafer for metalization.

Figure 2E:
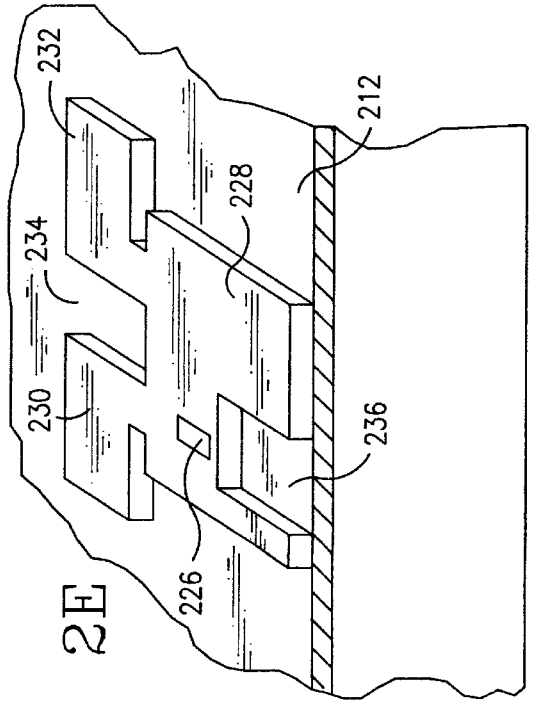

Metalization and coarse patterning of the metal is illustrated in FIG. 2E. A metal layer 228, preferable sputtered aluminum, is deposited onto the top surface of dielectric layer 212, which insulates the metal from the silicon, except in regions where a via 226 has been opened. The metal contacts the silicon in the via to form an ohmic contact. Because the metal is sputtered on a mostly continuous dielectric surface, the resulting metal layer can be patterned easily, using lithographic methods. To do this, a layer of photoresist (not shown) is exposed and developed, and the pattern is transferred to the metal with wet chemical etching or RIE. Since the feature sizes are generally greater than 5 um for this coarse patterning step, these lithography and etching steps are generally non-critical. The purpose of this coarse metal patterning step is to define multiple interconnects and pads for the microstructure to be formed in the wafer. Thus, for example, pads 230 and 232 are aligned with the eventual placement of microstructure beam elements and are separated by a gap 234. Metal is also removed in region 236 to break the conduction path on one of the eventual beam elements.

Figure 2F:
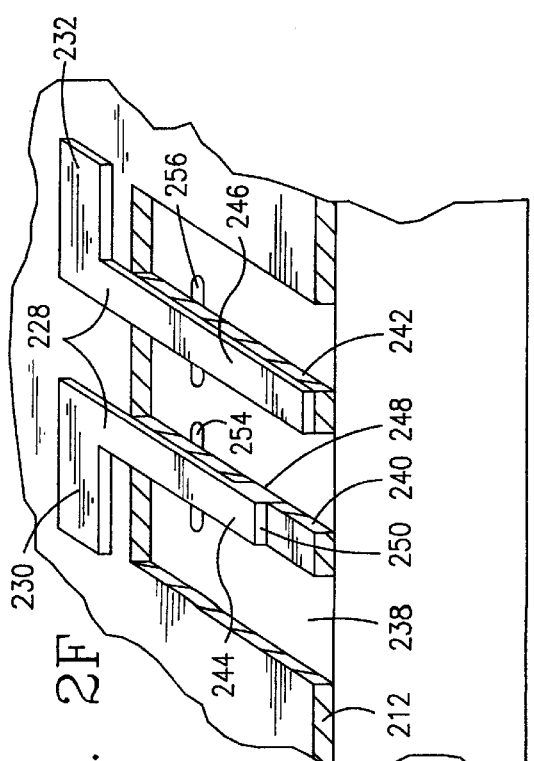

The final lithography layer, which is used to produce the micromechanical structure, is exposed and developed according to the illustration in FIG. 2F. The photoresist pattern (not shown) is transferred to the metal layer 228 and to the dielectric layer 212 using RIE techniques and defining an opening 238 in the metal and dielectric layers in which beam elements 240 and 242 are placed. This opening serves as a mask for subsequent trench etching steps. The lithography also defines in the metal layer 228 two metal interconnects 244 and 246 which attach to pads 230 and 232, respectively. The via through the dielectric layer 212 defined in FIG. 2D is apparent at the location of the metal-silicon contact at 248. The metal interconnect 244 is terminated at location 250, a result of the coarse metal patterning step.

The pattern transfer process etches the metal and dielectric to expose the silicon surface 252 and isolation segments 254 and 256 in the mask opening 238. The photoresist layer may remain or be removed for the deep silicon trench etch illustrated in FIG. 2G, which defines a deep trench 258 surrounding silicon mesas or islands 260 and 262. The trench etch is carried out to a depth less than the depth of the isolation segments 254 and 256, which are exposed during the etch, as illustrated. The isolation segments are positioned by the lithography process so that they completely intersect and are perpendicular to the mesas 260 and 262. The anisotropic nature of the etch, coupled with the reentrant geometry of the segments themselves, ensures that no silicon filaments surround the exposed surface 264 of the segments 254 and 256, for such filaments eventually would provide a current path to the substrate 202. The single mask opening 238 forces the metal interconnects 244 and 246 to be self-aligned with the dielectric layers 266 and 266' and the respective mesas 260 and 262. The etch process used, in the preferred embodiment of the invention, is the Bosch process described in U.S. Pat. No. 5,501,893, which etches silicon selectively to the metal layer 228 and the dielectric layer 212, so that no degradation of the layers occurs during the structure trench etch.

In FIG. 2H, the microstructure is prepared for undercut and release of the beams according to the '703 patent by a sidewall passivation scheme. A dielectric, preferably silicon dioxide, is deposited using CVD techniques and forms a thin film on all surfaces. The thickness of the deposited film is less than 500 nm, and must be deposited at a temperature which will not harm the metal layer 228. Preferably, the film which will form the sidewall passivation dielectric is deposited using PECVD or HDPCVD techniques and conformally coats all exposed surfaces. After the deposition, a blanket anisotropic RIE etch removes the film from the floor 270 of the trench 258 and from all other horizontal surfaces, such as the top surface 272 of the metal layer 228. Due to the anisotropic nature of the etch, sidewall films 274 of the mesas remain intact to provide sidewall passivation which protects the silicon mesas 260 and 262 from the isotropic silicon release etch processes.

FIG. 2I illustrates a released microstructure after a release etch sequence which follows sidewall passivation. Often, the release etch is comprised of two separate etches; a trench extension which exposes a larger silicon surface area and an isotropic release etch which undercuts the silicon mesas to form released beams 276 and 278. The trench extension is similar to the structure etch of FIG. 2G, and deepens the trench 258 to expose silicon below the sidewall film 274. This is followed by an isotropic release etch which can be performed in a high density etch chamber in a mixture of $SF_6$ and Argon. The release etch is timed so that beams 276 and 278 are completely undercut and suspended over the silicon floor 280, while wider features such as wall 282 remain fixed to the substrate. The isolation segments 254 and 256 extend downwardly through the beams, as illustrated in FIG. 1H, to isolate the silicon of the beams 276 and 278 from the silicon of the substrate 202. The metal pads 230 and 232 are connected to the beams at selected via locations by means of interconnects 244 and 246, resulting in multiple conduction paths or multiple connections to the microstructure. It is understood that the beams 276 and 278 preferably are a part of a larger micromechanical structure with an array of similar beams and interconnects, and are intended only to represent the isolation process. The sidewall films 274 can remain on the microstructures or be removed by an isotropic dielectric etch. In general, the sidewall passivation film can be removed if its presence affects the behavior of the micromechanical structure.

Figure 3:
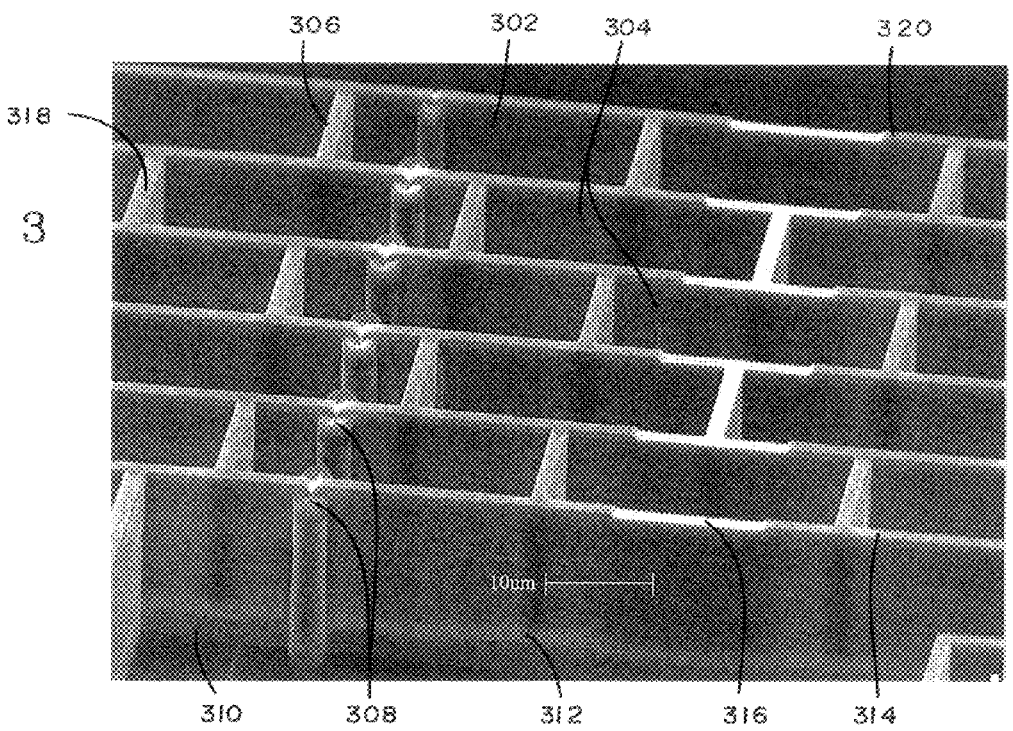
FIG. 3 is a photomicrograph showing the isolation segments and metal conduction layer on a released microstructure.

FIG. 3 is a photomicrograph of a portion of a released 20 um tall micromechanical structure employing the isolation segments of the invention. The released structure 302 consists of a grid of cantilever beams 304 with crossbeams 306 for support of the array. The isolation segments 308 separate the portions 310 of the silicon beams to the left of the segments from the portions 312 of the beams to the right of the segments. Conductive metal layer 314 runs along the top of each beam, except in the regions 316 where the metal layer has been broken during the coarse metal patterning step. As a result, the conducting path 318 is separate from the conducting path 320. It is understood that this is only a portion of the overall micromechanical structure, and that numerous geometries and conduction paths are possible using the herein disclosed technology.

Figure 4:
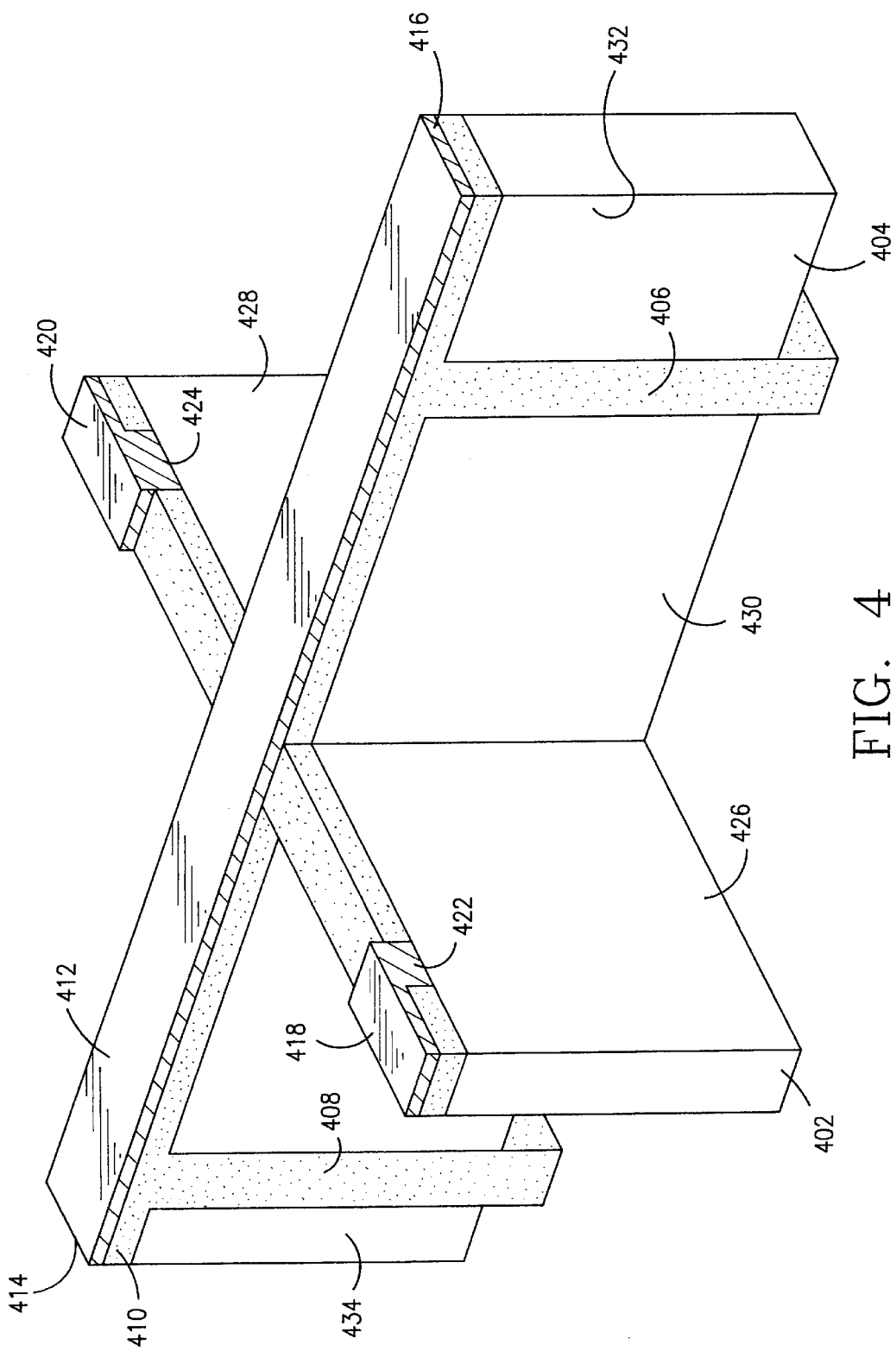
FIG. 4 illustrates a multiple level interconnect scheme resulting from the basic process.

The process of the basic invention provides a great deal of functionality. As an example, a multiple level electrical interconnect results from the basic process without any additional fabrication steps. FIG. 4 illustrates a multiple level interconnect with the intersection of two silicon beams 402 and 404. Beam 404 has integral electrical isolation segments 406 and 408, a dielectric top layer 410, and a metal layer 412. Conduction through the continuous metal layer 412 allows current to flow from one end of the metal line 414 to the other end 416. This current or applied potential is isolated from the silicon beam 404 beneath by means of the insulator 410. Another electrical conduction path is provided by the cross beam 402 through electrodes 418 and 420, by means of the metal-silicon contacts 422 and 424. Current flows from the metal conductor 418 through the contact 422, through the silicon beam portions 426 and 428, back through the contact 424 and out the metal conductor 420. Since the silicon beam segment 430 is fixed to beam segments 426 and 428, it remains part of the conduction path. However, the silicon beam segments 432 and 434 are isolated from the conduction path by means of isolation segments 406 and 408.Therefore, a two level contact path is allowed; one through the metal layer 412 and the other through the silicon beam 402. Whereas other processes require additional masking layers to create two or more levels of interconnection, the electrical isolation process described above contains all the processing required to form a multiple level interconnect using the silicon beam microstructures.

It is often advantageous to merge micromechanical structures with integrated circuits for control of actuation or high performance sensing, and the present invention eliminates need for a separate integrated circuit chip alongside the micromechanical device chip for complete system operation. The process of the basic invention can be implemented with on-chip integrated circuits as shown in FIGS. 5A–5H and FIGS. 6A–6I. The process in FIGS. 5A–5H allows a wafer first to be processed to include a fully functional integrated circuit and circuit components; thereafter, a micromechanical device is formed on the wafer using the basic invention. A basic restriction on this integration process is that the temperatures achieved in processing the micromechanical device must not damage the existing circuits. Usually, this requires that process temperatures not exceed 360° C., or approximately the temperature at which silicon and aluminum react. At even higher temperatures, such as 600° C., the aluminum metal leads typically used in integrated circuits will melt, rendering the circuit useless. Accordingly, the process temperatures achieved in the micromechanical device process must not exceed 350° C.

In FIG. 5A, it is assumed that a conventional integrated circuit process has been completed on a silicon wafer 502, resulting in a functional circuit. A passivation dielectric layer 504, preferably silicon dioxide, remains on the wafer after the process to protect the circuit. The edge of the integrated circuit in FIG. 5A is represented by the metal pad 506, connected, for example, to circuit layer 508. The wafer 502 includes a region 510 which is left free from circuit components and this is where the micromechanical structure is to be placed. A contact region 512 for metal to silicon contacts in the micromechanical structure is prepared prior to micromechanical device fabrication during the integrated circuit process to eliminate the high temperature implant anneal step which would damage a previously existing integrated circuit. The basic process of the invention now proceeds as in FIG. 1, starting with the lithographic definition of an isolation trench 514 in a resist layer 516. The pattern is transferred to the dielectric layer 504 by reactive ion etching.

In FIG. 5B, an isolation trench 518 is formed by the deep silicon etch techniques described earlier. The trench 518 may be tapered to match with the trench filling process depicted in FIG. 5C. Because of the high temperature restrictions, the dielectric 520 filling the trench 518 must be deposited using low temperature chemical vapor deposition techniques. Techniques such as plasma enhanced chemical vapor deposition (PECVD) of TEOS and high density plasma chemical vapor deposition (HDPCVD) can fill high aspect ratio trenches at temperatures less than 300° C. The deposition process will often leave a void 522, a thicker dielectric layer 524 on the surface of the wafer, and an indentation 526 on the surface 528 in the location of the isolation trench.

A planarization sequence, as illustrated in FIG. 5D, removes part of the dielectric layer 524 to form a new layer 530 and leaves a flat surface 532, ensuring that lithography and metal deposition steps to follow are free of any topographic effects. In FIG. 5E, a second lithographic step forms contact vias 534 and 536. A photoresist 538 is exposed and developed, and a via pattern is transferred through the dielectric 530. The via pattern exposes both contact region 512, where contact is to be made to the silicon beams, and metal pad 506, where the integrated circuit is accessed.

After the photoresist is stripped, a metal layer 540 is sputter deposited to form contacts 542 and 544, as illustrated in FIG. 5F. It is understood that this is a sample beam cross section only, and not all beams comprising the micromechanical device will require connection to the integrated circuit at 544. By opening vias to both the integrated circuit pad 506 and the micromechanical silicon contact 512, and using the metal layer 540, the integrated circuit is electrically connected to the micromechanical structure. A low temperature sintering step is commonly used to activate the contacts.

FIG. 5G illustrates the coarse metal patterning step used to define the conduction paths on the micromechanical structure. Resist 546 is exposed and developed, and the resulting pattern is transferred to the metal in region 548. This step separates the metal segment 550 from the metal segment 552, creating a multiplicity of metal paths comprising the interconnect geometry for the micromechanical structure. Finally, in FIG. 5H the micromechanical beam 554 is etched according to the process described in FIG. 2, the resist pattern 556 being transferred through the metal, dielectric, and silicon layers using reactive ion etching. The beams are then released with a sidewall passivation and isotropic etching sequence to produce a cavity 558 separating the beam 554 and the substrate 502. The filled isolation trench 518 separates the silicon of the micromechanical structure from the substrate silicon 502 and from the functional devices of the integrated circuit.

Figure 6A:
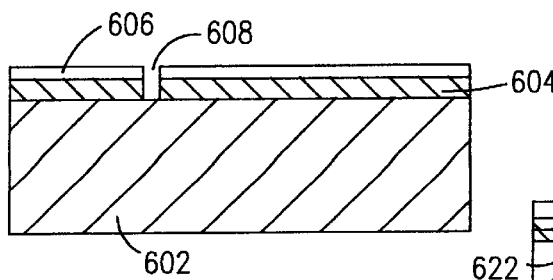
FIGS. 6a–6i illustrate an alternative method to merge the microstructure process with an integrated circuit.
Figure 6B:
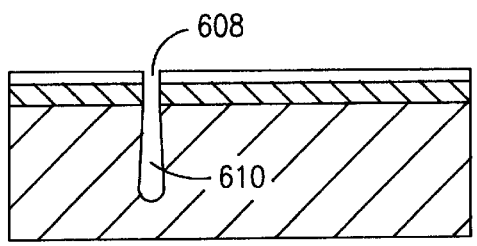
Figure 6C:
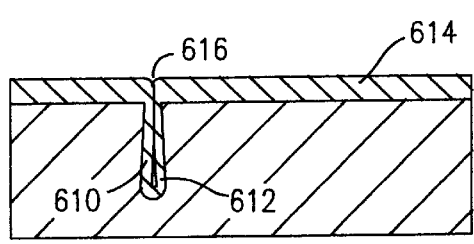
Figure 6D:
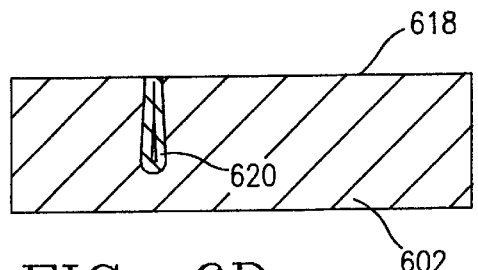

The process as described in FIG. 5 achieves complete separation of the integrated circuit and micromechanical device fabrication steps. Another process for integration is illustrated in FIGS. 6A–6I, where the isolation trench is etched and filled prior to formation of the integrated circuit. The process follows those of FIG. 1 and FIG. 5 but varies in that the basic isolation process is interrupted to form the integrated circuit. It is described as follows:

As illustrated in FIG. 6A, a silicon wafer 602 has a dielectric mask layer 604 and resist layer 606 which are used to define an isolation trench opening 608 using photolithography. The silicon isolation trench 610 in FIG. 6B is etched, using the aforementioned techniques, through the mask opening 608. FIG. 6C depicts the trench fill as dielectric 612 is deposited in trench 610, preferably using high temperature thermal oxidation. Since at this point in the process no integrated circuits exist, high temperature steps can still be performed. The thermal oxidation leaves a surface dielectric layer 614, and an indentation 616 in the region of the trench. The indentation and top surface dielectric is completely removed using planarization, resulting in a silicon wafer 602 with a polished silicon surface 618 and integral filled isolation trench 620, illustrated in FIG. 6D. The planarization can be performed with deposition and etchback as described earlier or with chemical-mechanical polishing.

Figure 6E:
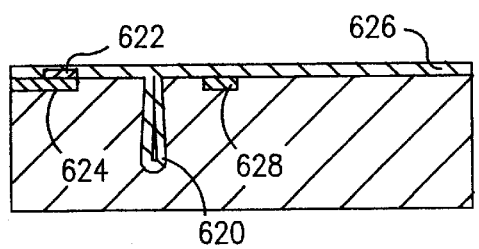
Figure 6F:
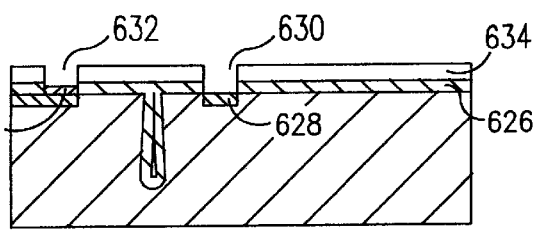
Figure 6G:
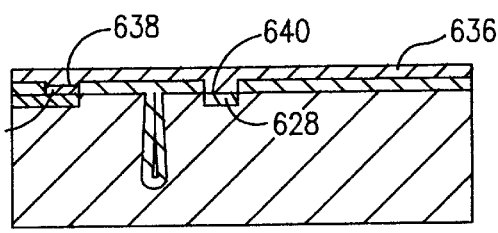
Figure 6H:
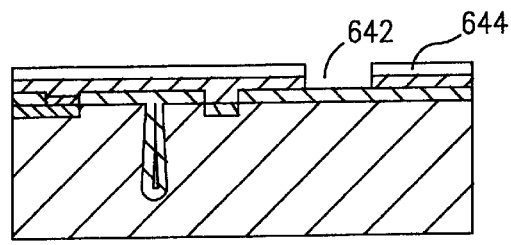
Figure 6I:
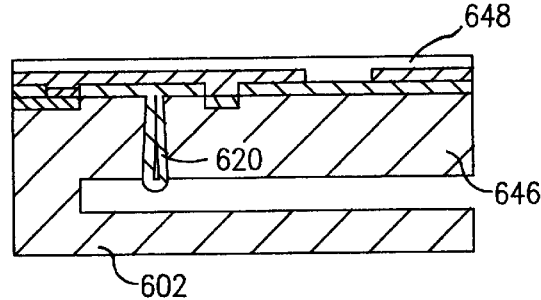

At this juncture the integrated circuit and circuit components are fabricated in accordance with known practice. As illustrated in FIG. 6E, the location of the isolation segment 620 is spaced away from that of the integrated circuit, and its presence has no effect on the circuit fabrication processes. The integrated circuit incorporates a metal pad 622 shown connected to a sample junction 624. Also created during the circuit fabrication is a dielectric passivation layer 626 and a contact region 628. The passivation layer 626 may be used as the micromechanical device insulator or replaced with a similarly deposited dielectric. The process then proceeds as described in FIGS. 5E–5H. In FIG. 6F, vias 630 and 632 are created in the resist 634 and are transferred through the dielectric 626 to expose the integrated circuit metal pad 622 and contact region 628. After the resist is stripped, a metal layer 636, preferably aluminum, is sputter deposited in FIG. 6G, contacting the integrated circuit metal pad 622 at the surface 638 and the silicon beam contact region 628 at the surface 640. In FIG. 6H, the metal is coarsely patterned in the region 642 using the photoresist layer 644 and wet chemical or reactive ion etching. The micromechanical beam structure 646 is formed in FIG. 6I using the resist patterned structure layer 648 and the series of etch and passivation steps described in FIGS. 1, 2, and 5. The resulting beam structures are free standing over the substrate 602 and are electrically isolated from the silicon substrate and the integrated circuit by the filled isolation trench 620.

Although the invention has been described in terms of preferred embodiments, it will be apparent to those of skill in the art that numerous variations and modifications may be made without departing from the true spirit and scope thereof, as set forth in the following claims.

What is claimed is:

1. A micromechanical structure comprising:
   a substrate containing a cavity;
   a beam suspended within said cavity, and
   a transverse isolation segment integral with said beam, wherein the outermost surfaces of said isolation segment extend beyond the sides of said beam in the transverse direction and beyond the bottom of said beam in the vertical direction.

2. The device of claim 1, wherein said isolation segment is located in said beam to provide electrical discontinuity between immediately adjacent beam sections while maintaining mechanical integrity of said beam.

3. The device of claim 2, wherein said isolation segment is composed of silicon dioxide.

4. The device of claim 1, wherein said isolation segment consists of a trench filled with silicon dioxide in said beam, said trench extending through the entire thickness of said beam.

5. The device of claim 4, wherein said trench has a re-entrant profile.

6. The device of claim 4, wherein the width of said trench measured along the longitudinal axis of said beam is less than 5 microns.

7. The device of claim 1, wherein said beam has a width less than 5 microns and a height greater then 10 microns.

8. The device of claim 1, wherein said isolation segment is composed of chemical vapor deposited silicon dioxide.

9. The device of claim 1 further comprising:
  an electrically conductive layer on top of said beam and on top of said transverse isolation segment, said layer being insulated from said beam by an intervening electrically insulating layer; and
  an electrical connection between said electrically conductive layer and said beam.

10. The device of claim 9, further comprising an electronic device fabricated in the same substrate as said beam and an electrical connection between said electronic device and said beam said beam being electrically insulated from said electronic device by said integral isolation segment in said beam.

11. A multi-level interconnect for a micromechanical device comprising:
  a first electrical conduction path provided by bulk material comprising a micromechanical device;
  isolation segments breaking said first conduction path into a plurality of independent electrical conduction paths;
  a second electrical conduction path comprising an electrically conductive layer insulated from said bulk material;
  selective interconnections between said first and second electrical conduction paths; and
  a cross-over between said first and second electrical conduction paths wherein said paths intersect without making electrical connection therebetween.

12. A released micromechanical beam cantilevered from a mesa and electrically insulated from said mesa by an isolation segment, transverse to and integral with said beam, extending beyond the sides and bottom of said beam.

13. A micromechanical device comprising:
  released beams cantilevered above a substrate from mesas affixed to said substrate, each of said beams comprising a conductive core, an insulating layer on top of said core, and a conductive layer on top of said insulating layer;
  an isolation segment integral to and extending beyond the sides and bottom of at least one of said released beams to provide electrical isolation between adjacent segments of said beam conductive core;
  wherein said isolation segment is located in close proximity to a junction between said at least one released beam and the mesa from which said beam extends so as to minimize a parasitic circuit element formed by the length of said conductive layer on said insulating layer over said conductive core in the region where said conductive core is in electrical contact with said mesa.

14. The device of claim 13, wherein said isolation segment is transverse to and integral with said beam.

* * * * *